US011469351B2

(12) United States Patent
Li et al.

(10) Patent No.: US 11,469,351 B2
(45) Date of Patent: Oct. 11, 2022

(54) LIGHT EMITTING DEVICE

(71) Applicant: Sean Suixiang Li, Turramurra (AU)

(72) Inventors: Sean Suixiang Li, Turramurra (AU); Anh Pham, Eastgardens (AU)

(73) Assignee: Sean Suixiang Li, Turramurra (AU)

(*) Notice: Subject to any disclaimer, the term of this patent is extended or adjusted under 35 U.S.C. 154(b) by 188 days.

(21) Appl. No.: 16/496,336

(22) PCT Filed: Mar. 21, 2018

(86) PCT No.: PCT/AU2018/000040
§ 371 (c)(1),
(2) Date: Sep. 20, 2019

(87) PCT Pub. No.: WO2018/170531
PCT Pub. Date: Sep. 27, 2018

(65) Prior Publication Data
US 2020/0035861 A1 Jan. 30, 2020

(30) Foreign Application Priority Data

Mar. 21, 2017 (AU) .................. 2017900992

(51) Int. Cl.
H01L 27/32 (2006.01)
H01L 33/26 (2010.01)
(Continued)

(52) U.S. Cl.
CPC ............ *H01L 33/26* (2013.01); *H01L 31/032* (2013.01); *H01L 31/072* (2013.01); *H01L 33/005* (2013.01)

(58) Field of Classification Search
CPC ..... H01L 33/26; H01L 31/072; H01L 31/032; H01L 33/005; H01L 27/12;
(Continued)

(56) References Cited

U.S. PATENT DOCUMENTS 9,806,164 B1* 10/2017 Terrones ........... H01L 21/02499
2009/0021159 A1* 1/2009 Lee .................... H01L 51/5092
313/504

(Continued)

OTHER PUBLICATIONS

Jin et al. ("Colloidal Single-Layer Quantum Dots with Lateral Confinement Effects on 2D Exciton", Oct. 3, 2016, Journal of the American Chemical Society 138 (40), 13253-13259) (Year: 2016).*

(Continued)

*Primary Examiner* — Samuel Park
(74) *Attorney, Agent, or Firm* — Polsinelli PC

(57) ABSTRACT

The present disclosure relates to a solid-state light emitting device, a solid state light absorbing device and methods for fabricating the same. In particular, the present disclosure relates to a light emitting device comprising: a transition metal dichalcolgenide layer disposed between two layers of a material with a bandgap larger than the transition metal dichalcolgenide layer; a plurality of nanoparticles embedded into the transition metal dichalcolgenide layer and being arranged to form a plurality of allowable energy levels within the bandgap of the transition metal dichalcolgenide layer; and electrodes arranged to apply a voltage across the two layers and the transition metal dichalcolgenide layer; wherein, when a voltage within a predetermined range is applied to the electrodes, photons with a wavelength within a specific wavelength range are emitted by the device and the wavelength range can be varied by varying the voltage across the two layers and the transition metal dichalcolgenide layer.

11 Claims, 5 Drawing Sheets

(51) Int. Cl.
*H01L 31/072* (2012.01)
*H01L 31/032* (2006.01)
*H01L 33/00* (2010.01)

(58) Field of Classification Search
CPC ... H01L 27/32–326; H01L 51/50–5012; H01L 2227/32–326; H01L 2251/5323–5361; H01L 2924/12044; H01L 51/05; H01L 27/01; Y02E 10/50
See application file for complete search history.

(56) References Cited

U.S. PATENT DOCUMENTS

| | | | |
|---|---|---|---|
| 2011/0065348 A1* | 3/2011 | Miida | H01J 63/02 445/1 |
| 2015/0122315 A1* | 5/2015 | Shin | H01L 29/778 136/255 |
| 2016/0186653 A1* | 6/2016 | Viladrich | B32B 15/088 123/198 R |
| 2016/0211422 A1* | 7/2016 | Kazama | H01L 33/501 |
| 2016/0300983 A1* | 10/2016 | Strassburg | H01L 33/08 |
| 2016/0336526 A1* | 11/2016 | Hirosawa | H01L 51/502 |
| 2017/0373263 A1* | 12/2017 | Stubbs | H01L 51/5088 |
| 2018/0009676 A1* | 1/2018 | Pickett | B82Y 40/00 |
| 2018/0025200 A1* | 1/2018 | Frye | G06F 21/32 257/9 |
| 2018/0072947 A1* | 3/2018 | Pickett | C30B 33/00 |
| 2018/0186653 A1* | 7/2018 | Daniels | H01L 21/02628 |
| 2018/0216000 A1* | 8/2018 | Daniels | C07C 211/21 |
| 2021/0047561 A1* | 2/2021 | Daniels | C01G 39/06 |

OTHER PUBLICATIONS

Jin et al. (Colloidal Single-Layer Quantum Dots with Lateral Confinement Effects on 2D Exciton, Oct. 2016, J. Am. Chem. Soc., 138, 40, 13253-13259) (Year: 2016).*
International Search Report and Written Opinion; PCT Application No. PCT/AU2018/000040; dated May 23, 2018.
Ross, J. S. et al., "Electrically tunable excitonic light-emitting diodes based on monolayer WSe 2 p-n junctions." Nature nanotechnology 9 (2014): pp. 268-272.
Mukherjee, S. et al., "Tunable direct bandgap optical transitions in MoS2 nanocrystals for photonic devices." Acs Photonics 2 (2015): pp. 760-768.
Wang, Q. H. et al., "Electronics and optoelectronics of two-dimensional transition metal dichalcogenides." Nature nanotechnology 7 (2012): pp. 699-712.
"OLED" Wikipedia, Wikimedia Foundation, accessed Feb. 28, 2022, 41 pages. https://en.wikipedia.org/wiki/OLED#Working_principle.
"Introduction to Wide Bandgap Semiconductors", Navitas, accessed Feb. 28, 2022, 9 pages. https://navitassemi.com/introduction-to-wide-bandgap-semiconductors/.

* cited by examiner

LIGHT EMITTING DEVICE

CROSS-REFERENCE TO RELATED APPLICATIONS

This application is a national stage entry of PCT/AU2018/000040 filed Mar. 21, 2018, which is expressly incorporated herein in its entirety.

This application claims priority from Australian provisional application number 2017900992 the entire contents of which are incorporated herein by cross-reference.

FIELD OF THE INVENTION

The present invention relates to a solid-state light emitting device and methods for fabricating the same. In particular, the present invention relates to a solid-state light emitting device with tunable light emission and a photovoltaic converter with a tunable absorption.

BACKGROUND OF THE INVENTION

Solid-state Light Emitting Devices (LEDs) are widely used nowadays in a wide range of applications, from lighting, displays to electronic communications.

The majority of commercially available solid-state LEDs comprise semiconductor materials and are capable of emitting wavelengths in the same colour range (blue LEDs, green LEDs, etc.).

Furthermore, most LEDs are based on III-V semiconductors, such as GaN and InN. A major challenge in commercial GaN based LEDs is that the conversion efficiency of electricity into light (photons) drops as the input current to the device increases. This phenomenon is also known as 'efficiency droop' and is intrinsically linked to the nature of the GaN material.

Recently, commercial LED research has focused on designing tunable wavelength LED with an acceptable power to light conversion efficiency. These LEDs could have a broad range of applications, from LED screens, lighting to wireless telecommunication applications.

The proposed designs of GaN-based tunable LEDs rely on altering the band gap of the InGaN/AlGaN heterostructure by varying the In content in the alloy. This approach, however, can potentially result in multiple defects, given the high concentration of In, and also increase the cost of production, as it would require multiple InGaN/AlGaN heterostructures with different In concentrations assembled in a single platform.

In addition, in GaN based LEDs, non-radiative recombination, such as Auger recombination, of electrons and holes becomes an issue when the carrier density is high. This creates a further constraint on the design and application of LED-based electronics. Further, the efficiency droop results in larger thermal dissipation which inhibits nano-scaling of LED devices in electronic devices.

SUMMARY OF THE INVENTION

Embodiments of the invention relate to a solid-state light emitting device (LED) with a tunable emission wavelength.

The light-emitting layer of the device includes a transition metal dichalcolgenide layer that comprises a plurality of embedded nanoparticles that form a plurality of allowable energy levels within the bandgap of the transition metal dichalcolgenide layer. Alternative embodiments are related to a photovoltaic converter that comprises a light-absorbing layer that has a configuration similar to the light-emitting layer of the LED.

In accordance with the first aspect, the present invention provides a light emitting device comprising:
  a transition metal dichalcolgenide layer disposed between two layers of a material with a bandgap larger than the transition metal dichalcolgenide layer;
  a plurality of nanoparticles embedded into the transition metal dichalcolgenide layer and being arranged to form a plurality of allowable energy levels within the bandgap of the transition metal dichalcolgenide layer; and
  electrodes arranged to apply a voltage across the two layers and the transition metal dichalcolgenide layer;
  wherein, when a voltage within a predetermined range is applied to the electrodes, photons with a wavelength within a specific wavelength range are emitted by the device and the wavelength range can be varied by varying the voltage across the two layers and the transition metal dichalcolgenide layer.

In an embodiment, the voltage within a predetermined range is applied to the pair of electrodes at room temperature and ambient pressure conditions.

In embodiments, the transition metal dichalcolgenide layer consists of tungsten diselenide ($WSe_2$). The tungsten diselenide layer may consist of less than 30 atomic monolayers of tungsten diselenide, five atomic monolayers of tungsten diselenide or, in some instances, a single atomic monolayer of tungsten diselenide.

In embodiments, some nanoparticles consist of tungsten diselenide. In some instances, all of the nanoparticles may consist of tungsten diselenide. The tungsten diselenide nanoparticles may be in the form of tungsten diselenide flakes or other forms. The tungsten diselenide flakes or nanoparticles with the specific sizes may be produced using a mechanical exfoliation or physical vapour deposition or chemical vapour deposition or laser radiation or high-energy irradiation including ion and UV irradiation or any processing from amorphous to recrystallization or others on the tungsten diselenide layers.

In some embodiments, the nanoparticles have different sizes. For example, two or more prevalent sizes of nanoparticles may be embedded into the transition metal dichalcolgenide layer. Nanoparticles with a specific size may be associated with a respective allowable energy level within the bandgap of the transition metal dichalcolgenide layer. Further, nanoparticles with a specific size may promote emission of photons within a specific wavelength range.

In some embodiments, the nanoparticles comprise a first set of tungsten diselenide nanoparticles with a size comprised between 2 nm and 3 nm (blue emission). Further, the nanoparticles may comprise a second set of tungsten diselenide nanoparticles with a size comprised between 5 nm and 6 nm (yellow emission). In addition, the nanoparticles may comprise a third set of tungsten diselenide nanoparticles with a size comprised between 9 nm and 10 nm (red emission). The standard deviation of nanoparticle size is between 0.5 nm and 2 nm. In general, the $WSe_2$ nanoparticles have a triangular shape, but in different however other configurations are possible.

In some embodiments, the light emitting layer or layers are disposed between two layers of a III-V material, such as BN.

In accordance with the second aspect, the present invention provides a method for manufacturing a light emitting device comprising the steps of:
  providing a substrate;

forming a transparent electrode on a portion of the substrate;

forming a first layer of a wide bandgap material onto a portion of the transparent electrode;

forming a transition metal dichalcolgenide layer onto a portion of the first layer; the transition metal dichalcolgenide layer comprising a plurality of nanoparticles arranged to form one or more allowable energy levels within the bandgap of the transition metal dichalcolgenide layer;

forming a second layer of a wide bandgap material onto a portion of the transition metal dichalcolgenide layer; and forming electrodes arranged to apply a voltage across the first layer and the second layer;

wherein, when a voltage within a predetermined range is applied to the electrodes, photons are emitted by the device.

The step of applying a voltage may be performed at ambient temperature and atmospheric pressure.

In embodiments, the transition metal dichalcolgenide layer consists of tungsten diselenide and the step of forming the tungsten diselenide layer may comprise the step of embedding a plurality of nanoparticles into the tungsten diselenide layer. The plurality of nanoparticles may consist of tungsten diselenide nanoparticles that may be in the form of tungsten diselenide flakes or other forms. Further, the method may comprise the step of annealing, using a laser at specific wavelength and/or power, the tungsten diselenide flakes.

In some embodiments, nanoparticles with different sizes are embedded in the same transition metal dichalcolgenide layer. In these embodiments, the device has a single light emitting layer.

Embodiments of the present invention allow generating light with different wavelengths using a single solid-state LED device. This allows mitigating efficiency droop problems of current LEDs and reducing size.

Alternative embodiments, allow tuning the absorption energy of a PV device. Advantages of these embodiments are related to applications where energy must be generated from light sources with specific or variable emission wavelengths, such as indoor PV applications and wireless telecommunication.

Advantages of embodiments of the invention include the capability to control the intensity of emitted light at different wavelengths to achieve precise combinations.

Further, embodiments of the invention may be used for high-resolution screens as they may enable to combine emission different colours in the same chip footprint, therefore reducing the size a pixel in the matrix of pixels.

In addition, the emitted lights with various wavelengths can significantly enhance the capacity of telecommunication signals or channels via optical fibres or Li-Fi technology.

Furthermore, lights with tunable wavelengths emitted by a single LED allows enhancing the resolution of LED display at much lower cost.

The LED with tunable wavelength can also be used for agriculture lightings to facilitate plant growing.

The LED device can be fabricated on transparent and flexible substrates suitable for wearable mobile and medical devices.

BRIEF DESCRIPTION OF THE DRAWINGS

Features and advantages of the present invention will become apparent from the following description of embodiments thereof, by way of example only, with reference to the accompanying drawings, in which.

DETAILED DESCRIPTION OF EMBODIMENTS

In the following description a solid-state LED device with a tunable emission wavelength and a PV device with tunable absorption are described. In some embodiments, the light-emitting layer of the LED is based on one or more transition metal dichalcolgenide layers that comprise embedded nanoparticles. The nanoparticles form allowable energy levels within the bandgap of the transition metal dichalcolgenide layer. In alternative embodiments, the transition metal dichalcolgenide layers may function as a light-absorbing layer in a PV device.

Figure 1:
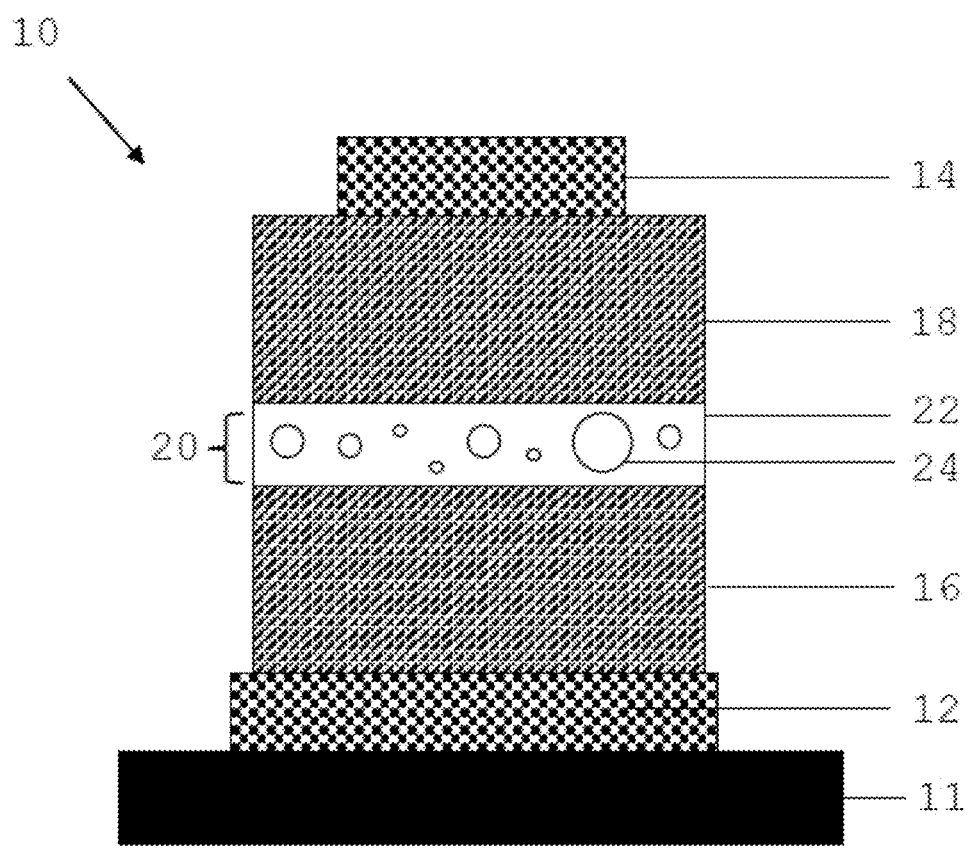
FIG. 1 shows a schematic representation of an LED device in accordance with embodiments.

Referring now to FIG. 1, there is shown a schematic configuration of an LED device 10 in accordance with embodiments. Device 10 is deposited on a substrate 11 and has a vertical quantum well structure. The device has a bottom electrode 12 and a top electrode 14, in the example of FIG. 1 both made of graphene. A first layer of a wide band gap material 16 is formed on a surface of substrate 11. In this example layer 16 consists of BN. A single atomic layer (1 L) of $WSe_2$ 20 is then formed on a surface portion of layer 16. Layer 20 comprises $WSe_2$ arranged in a planar configuration 22 and embedded $WSe_2$ nanoparticles 24.

A further layer of BN 18 is formed in contact with the light emitting layer 20 to complete the vertical quantum well structure.

In alternative embodiments, the LED device may have a light emitting layer that comprises multiple atomic layers of $WSe_2$, for example up to five.

Nanoparticles 24 have different sizes and can be formed using several methods as explained below. In the embodiment described, nanoparticles 24 consist of tungsten diselenide and are produced by laser radiation with a wavelength of 532 nm and 300 mW that powers passing through an optical microscope. The laser beam is focused by an objective lens to create a spot size of 1 μm onto the sample surface.

Nanoparticles 24 have three different average sizes. A first set of nanoparticles has an average size between 2 nm and 3 nm. A second set of nanoparticles has an average size between 5 nm and 6 nm and a third set of nanoparticles has an average size between 9 nm and 10 nm. The device illustrated in FIG. 1 provides a high level of integration as it is controlled by using only one pair of electrodes. The relative light intensities can be tuned by controlling the relative amount of nanoparticles in the light emitting layer.

The thickness of tunnel barrier h-BN layers 16, 18 is critical for the performance of device 10. Charge carriers are injected from the highly conductive transparent graphene electrodes via the h-BN to the $WSe_2$ layer(s). Such a process, requires careful control of the dwell time of the injected electrons and holes in the layer with 2D $WSe_2$ quantum dots as photoemission is a slow process in comparison with the characteristic time required to penetrate the junction between graphene and $WSe_2$.

For example, an extremely thin h-BN layer may allow carriers to directly tunnel from one electrode to another, thus reducing the efficiency of current-to-light conversion as the carriers do not stay in the $WSe_2$ long enough. The dwelling time can be controlled by optimizing the thickness of h-BN layers as the tunnel barriers. In the embodiment described herein, h-BN layers with a thickness between a single molecular layer and five molecular layers are used to increase the time that the electrons and holes spend inside the 2D $WSe_2$ quantum dots to facilitate radiative recombination.

Similar to other 2D materials, the graphene, h-BN and $WSe_2$ can be fabricated with chemical vapour deposition (CVD), physical vapour deposition (PVD), mechanical exfoliation, electrochemical exfoliation and other technologies. As an example, in order to fabricate the high quality materials cost effectively on 4 inch substrates or larger size, the Applicants used a CVD methodology. The substrates used for the processing can be Ni, Cu, Fe, sapphire, Ge, Ge/Si, $SiO_2$/Si, $SrTiO_3$/GaAs, $SrTiO_3$/Si, SiC and other materials.

The availability of high-quality, large, single crystal Si wafers is fundamental to current Si-based electronics. It meets the primary requirements of cost-efficient, reliable, and high throughput synthesis over wafer-scale dimensions with methods compatible with current semiconductor technology.

Figure 2:
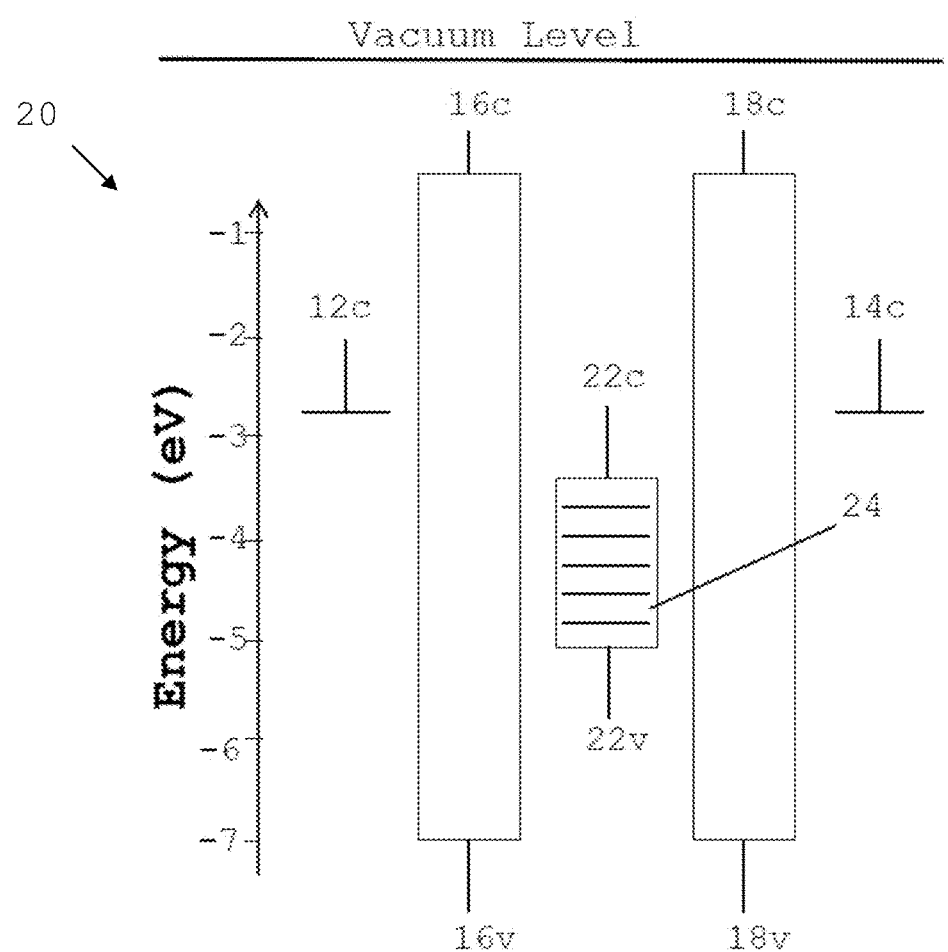
FIG. 2 schematically shows an energy band diagram for the device of FIG. 1.

FIG. 2 shows a schematic energy band diagram 20 for the device of FIG. 1. The energy level of conduction and valence band edges of the materials in FIG. 2 are plotted with reference to the vacuum level. The band diagram of FIG. 2 shows an 'unbiased' LED device, where the positioning and the slope of the band edges is not affected by the applied external voltage. During operation, due to the applied voltage, the energy bands will bend. Electrons and holes enter the device through the conductive bottom and top electrodes (12c and 14c). Electrons move through the $WSe_2$ conduction band 16c of BN layer 16 to the conduction band 22c of the $WSe_2$ layer 22. Holes move through the valence band 18v of BN layer 18 to the valence band 22v of the $WSe_2$ layer 22.

Electrons and holes recombine in layer 22 emitting photons within a given wavelength range. The wavelength range is determined by the configuration of the plurality of allowable energy levels 24 within the bandgap of the $WSe_2$ layer 22 and the voltage applied to electrodes 12 and 14.

In particular, the radiative recombination process depends on the relative position of the lowest unoccupied state of electrons and the highest occupied state of holes. Layer 22 contains multiple in-gap states, allowing for the combination of electron and holes at different energy levels in a single structure through voltage tuning of Fermi level, this results in the changing of the emission wavelength without assembling multiple devices with different band gaps. The in-gap states are generated by scaling the $WSe_2$ light-emitting layer to 0D, which exhibit discrete energy levels. When these levels interface with a sizable band gap material with correct work function the discrete energy levels will be positioned in the middle of the band gap playing the role of the in-gap states.

2D materials have emerged as promising candidates for flexible and inexpensive optoelectronic devices since they can be fabricated on a wide range of substrate through simple chemical or physical deposition techniques.

Transition metal dichalcogenide (TMD) materials, like $MoS_2$, have shown to be suitable candidates for LED devices. However, $MoS_2$-based LED devices have many disadvantages, such as low efficiency and broad line-width emission. Further, these devices only function in cryogenic temperature.

LED devices based on other 2D materials, such as reduced graphene/graphene oxide have been reported as the first tunable visible colour LED but these graphene based devices can only operate for tens of seconds in ambient environment. These limitations affect the application range of many 2D materials as LED devices.

The $WSe_2$ layer 22 can function as an efficient light emitting material under electronic excitation. However, unlike other 2D transition metal dichalcogenides and graphene based LED, the present Inventors have found that $WSe_2$ shows exceptional light emitting efficiency with narrow bandwidth due to the emission originated by the exciton binding of electron and hole and the large spin-orbit splitting. In addition, $WSe_2$-quantum well-based LED devices can operate without degrading performance at room temperature under ambient pressure. The devices disclosed herein use a light-emitting layer based on $WSe_2$ and embedded nanoparticles to create in-bandgap radiative states.

$WSe_2$ nanoparticles are used in the device described herein to obtain 0D exciton emission. The sample size can be controlled in a wide range of methods ranging from physical vapour deposition to mechanical exfoliation using nanotechnology. By controlling the sizes of the $WSe_2$ nanoparticles the light-emission properties of the LED can be controlled.

In the device described, the $WSe_2$ monolayer with embedded $WSe_2$ flakes 20 is positioned between layers BN to create a sharp emission peak. The quantum well structure enhances the emission intensity of the $WSe_2$ monolayer 20 and significantly reduces the bandwidth of the emission peak due to the nature of the confined $WSe_2$ layer 20. In addition, the wide band gap materials will not participate in the emission process since the applied voltage will not alter the chemical potential close to their conduction band due to their very large energy gap. Thus, only layer 20 participates in the emission process. Finally, to control the position of the Fermi level, the top and bottom electrodes 12 and 14 are placed on top and at the bottom of the quantum well structure. These electrodes can be made of different transparent conductive materials such as conductive oxides including ITO and ZnO, conductive polymers, metal, alloys, carbon materials, like graphene, and phase-engineered TMD material like $1T-WSe_2$. These layers play the role of the carrier injection into layer 20 to change the positions of the Fermi level and, therefore, the emission wavelength.

When a quantum dot-2D TMD hybrid structure undergoes an optical excitation, it creates an exciton whose energy is different from the exciton energy of the QD and of the 2D materials. This hybrid exciton is formed based on the electron resided on the QD structures, and the hole resided on the 2D TMD layer.

In alternative embodiments, different quantum dot (QD) materials, such as PbS, CdS, CdSe, and anti-perovskite halides may be used in the light-emitting region of the device. By selecting the appropriate material and the size of the quantum dot, the hybrid exciton energy levels and bandwidth can be tuned in a wide range. In addition, the QDs may be fabricated by conventional chemical synthesis which is inexpensive. Such a device based on the appropriate selection of the QD material provides a new efficient tunable LED device. Furthermore, the efficiency and performance of the WSe$_2$-QD layer is enhanced.

Figure 3:
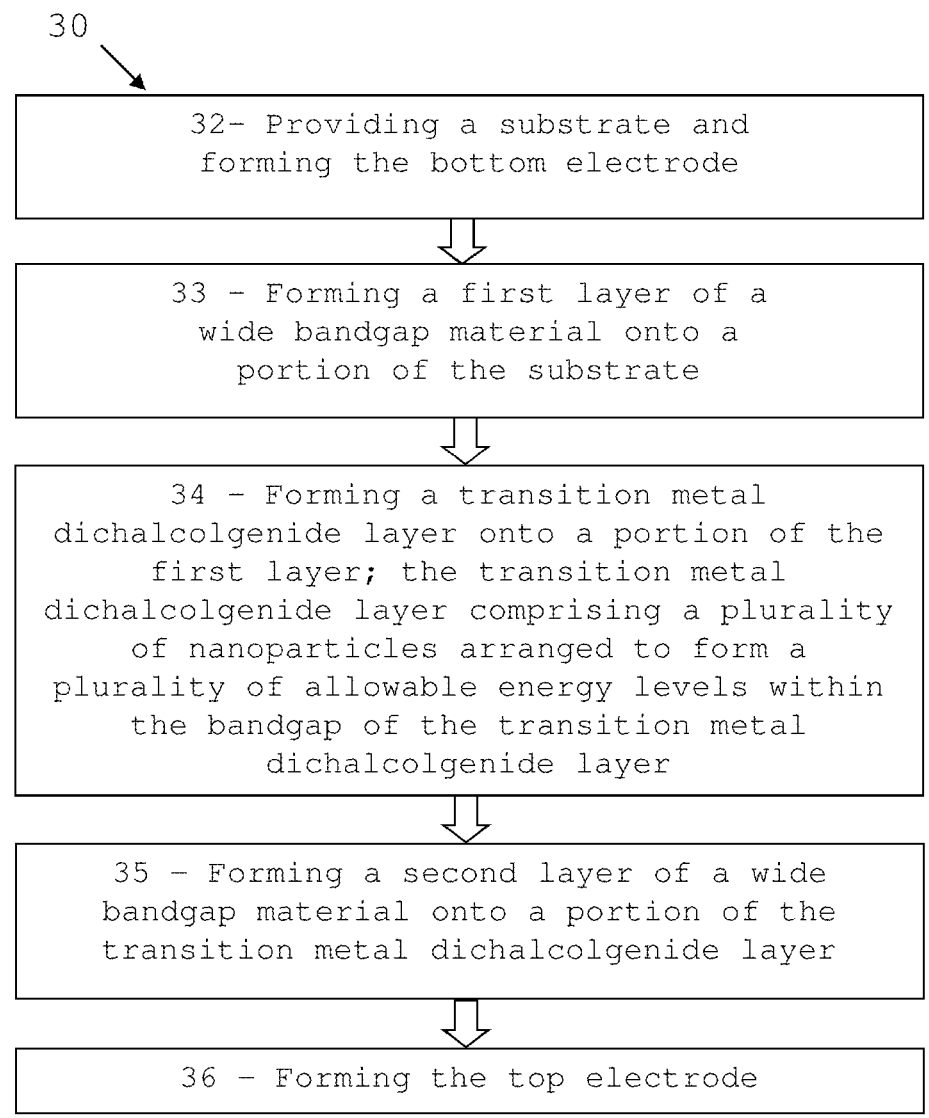
FIG. 3 is a flow diagram listing method steps used to manufacture an LED device in accordance with FIG. 1.

Referring now to FIG. 3, there is shown a flow diagram 30 listing method steps used to manufacture an LED in accordance with FIG. 3.

At step 32 a substrate is provided and a bottom conductive electrode is formed. The first layer of a wide bandgap material, BN in the embodiment described, is formed onto a portion of the substrate at step 33. At step 34, the transition metal dichalcolgenide layer, in the embodiment described WSe$_2$, is formed onto a portion of the first layer. The WSe$_2$ layer comprises a plurality of nanoparticles arranged to form a plurality of allowable energy levels within its bandgap. A second layer of BN is formed at step 35 to complete the vertical quantum well structure. At step 36, a top electrode is formed, a graphene electrode in the specific embodiment described.

During step 34, the formation of nanoparticles arranged to form a plurality of allowable energy levels within its bandgap, may comprise the step of forming WSe$_2$ flakes. The flakes are treated under an intense laser light with different exposure time and laser energy to alter the surface morphology and chemical adsorption on WSe$_2$. Such a technique allows engineering of the chemical and photonic properties of the WSe$_2$. The laser treatment can be tuned to control the band structure of the WSe$_2$ flakes.

Manufacturing Example 1

In an embodiment, the device described above with reference to FIG. 1 is grown on a Germanium template formed on a high quality silicon wafer.

Germanium is catalytic active, which can lower the energy barriers for the catalytic decomposition of carbon precursor to induce formation graphitetic carbon. Further, carbon has extremely low solubility in germanium even at the melting temperature of Ge, thus enabling growth the complete monolayer or multilayer graphene; germanium has very similar thermal expansion coefficient with graphene, supressing intrinsic wrinkle formation in graphene layers.

The crystallographic orientations of the Ge/Si substrates can be (001), (110) and (111) or others. The preparation parameters for the Ge/Si substrates 400 with various crystallographic orientations are the same. For example, to prepare the (110) single crystal Ge film 402 on (110) Si wafer 401, the (110) Si wafer 401 is chemically cleaned with 10% diluted HF to remove all types contaminants for creating an H-terminated surface. Subsequently the (110) Si wafer 401 is baked at 1000° C. in ultrahigh purity H$_2$ to remove the native oxide. The as-cleaned (110) Si wafer 401 is immediately loaded into a low-pressure CVD chamber with the pressure of ~3×10$^{-6}$ Torr. Using the flow rate of 40 sccm, the precursor of Germane (GeH$_4$) gas is purged into the chamber with a pressure from 10~30 Torr at 300~930° C. for 30 mins. With this process, a (110) Ge film 402 with thickness from 1 nm to 1 μm or thicker is formed on the (110) Si wafer 401. After the Ge growth, the post-annealing at 800° C. in H$_2$ is performed to reduce the threading dislocation density and ready for the fabrication of high quality graphene electrodes of 101, 204 and 301 on the as-prepared substrates.

After the deposition of (110) Ge buffer layer 402 on the (110) Si wafer 401, a mixture gas of Methane (CH$_4$) and ultrahigh purity H$_2$ is purged into the chamber with a total pressure of 100 Torr at 900~930° C. for 5~120 mins. Subsequently, the as-grown material is rapidly cooled to room temperature under vacuum, ready for the deposition of h-BN tunnelling barrier layers of 102, 205 and 302. Other graphene electrodes described in FIGS. 1, 2 and 3 can also be fabricated with the same or similar fabrication parameters.

To grow the h-BN tunnelling barrier layers, the as-prepared graphene/Ge/Si is transferred into another chamber to anneal in the purging Ar/H$_2$ or ultra-high purity H$_2$ with the pressure of 800 mTorr at 800° C. for 20 mins and then 1000° C. for 20 mins. At 130° C., the carrier gas Ar/H$_2$ or ultra-high purity H$_2$ takes the precursor ammonia borane (NH$_3$-BN$_3$) into the chamber for h-BN growing. The pressure of Ar/H$_2$ gas or ultra-high purity H$_2$ is kept at 400 mTorr. The thickness of h-BN is controlled by manipulating the growing time from 1 to 60 mins or longer. In fact, the h-BN/graphene layers can also be synthesized with different techniques, precursors and fabrication parameters. Other h-BN tunnelling barriers described in FIGS. 1, 2 and 3 can also be fabricated with the same or similar fabrication parameters. The 2D WSe$_2$ quantum dot layers is synthesized using the tungsten hexacarbonyl [W(CO)6, 99.99% purity] and hydrogen selenide [H2Se, 99.998% purity] or dimethyl selenide [(CH3)2Se, 99.99% purity] in the CVD chamber. The forming gas of Ar/H$_2$ or ultra-high purity hydrogen is used as the carrier gas through the bubblers and reactor to maintain a total flow rate at 450 sccm. The W(CO)6 powder is contained inside a stainless-steel bubbler, which is held at 30° C. and 727 Torr. The carrier gas is passed through the bubbler at a flow rate of 15 sccm, which results in a W(CO)6 flow rate of 9×10$^4$ sccm out of the bubbler. H$_2$Se is also contained inside a stainless steel bubbler, which is held at room temperature and 757 Torr. The carrier gas is passed through the bubbler at a flow rate in the range of 2.5-25 sccm, which resulted in a H$_2$Se flow rate of 0.75-7.5 sccm out of the bubbler. Growth is implemented at a total chamber pressure of 697 Torr, a growth time of 30 mins and h-BN/graphene/substrate temperature of 800° C. for all experiments. The overall size, shape and nucleation density of 2D WSe$_2$ quantum dots can be controlled by manipulating several processing parameters including Se:W ratio, substrate and substrate temperature, chamber pressure and fabrication techniques etc. For example, the size of 2D WSe$_2$ quantum dots increase with increased temperature and pressure. In addition, the size increases and the nucleation density decrease as the Se:W ratio is increased from 800 to 4800. Other WSe$_2$ layers described in FIGS. 1, 2 and 3 can also be fabricated with the same or similar fabrication parameters.

The fabrication parameters for spectrally tunable LEDs described can be altered depending on the instruments and synthesise techniques. For example, the flow rate of carrier gas or pressure is determined by the size and shape of the chambers. The temperature can also be lowered if Plasma Enhanced Chemical Vapour Deposition (PECVD) is used for the fabrication. The graphene/hBN/WSe$_2$/hBN/graphene layers can also be grown on the other catalysts, such as Cu foils first and then transferred on the SiO$_2$/Si substrate. The 2D WSe$_2$ quantum dots can also be fabricated through plasma, laser, ion irradiation or UV irradiation treatment on mono- or multilayered WSe$_2$ to produce the short-range order regions in the materials and then recrystallized by annealing the materials at a lower temperature. By manipulating the annealing temperature, the size of 2D WSe$_2$ quantum dots can be controlled precisely. Alternatively, the 2D WSe2 quantum dots can be synthesised by using colloidal chemistry methodology and then deposited on the 2D WSe$_2$ or h-BN/graphene heterostructures with spin coating, printing or other technologies.

Manufacturing Example 2

In embodiments, the device described above with reference to FIG. 1 is grown directly on a high quality silicon dioxide ($SiO_2$)surface.

A silicon dioxide surface with a thickness of 300 nm is provided on a silicon substrate and cleaned with acetone and ethanol for 15 min, respectively. The as-cleaned surface is used for the deposition of a stacked-layered van der Waals heterostructure.

The LED is structured as a stacked-layer van der Waals heterostructure of light emitting quantum wells, which has the configuration of graphene/h-BN/WSe2/h-BN/graphene. The monolayer of $WSe_2$, which contains $WSe_2$ quantum dots with three specified sizes, is encapsulated between thin (2-5 monolayers) hexagonal boron nitride (hBN) tunnel barriers with top and bottom transparent graphene electrodes for vertical current injection. Such a van der Waals heterostructure is fabricated using multiple "peel/lift" procedure in ambient. In this experiment, micromechanical cleavage with Scotch-tape is used to fabricate atomically thin layers from bulk crystals of graphite, h-BN and $WSe_2$. After exfoliating a layer of crystal from the bulk crystals with tape, three to ten repetitive exfoliations or more by folding tape are used to control the final thickness of the exfoliated flakes. More exfoliations result in a thinner layer and eventually achieve a monoatomic layer of the materials. For example, in the graphene bottom electrode fabrication, the tape surface, which contains graphene flakes, was pressed against the $SiO_2$/Si substrate and then peeled off rapidly. With this process, the graphene flakes with the desired thicknesses are left on the substrate. FIG. 4(a) shows an AFM image that shows a transparent monoatomic layered graphene 42 successfully deposited on a $SiO_2$/Si substrate. However, to stack the other layers on top of the bottom electrode graphene to form the van der Waals heterostructures, a poly (dimethyl)-siloxane (PDMS) stamps was used to transfer the fabricated layers with all dry transferring technology.

A mixture of poly dimethyl-siloxane and curing agent was poured into a Teflon mould, which was then placed into a vacuum desiccator for degasing. Subsequently a curing process was performed in an oven at 60° C. for 24 hours. FIG. 4(a) shows a piece of PDMS stamp with a thickness of 0.5 mm made by this experimental procedure.

In this embodiment, except for the bottom electrode of monoatomic-layered graphene, other atomically thin layers of materials are fabricated using the following procedure. Similar to the fabrication of bottom electrode graphene, Scotch-tape is used to exfoliate thin layers of the materials following by repetitive exfoliation till the thickness of flakes reach to the desired thickness. To fabricate a layer of h-BN tunnel barrier for bottom barrier, the tape that contains a three layer h-BN flakes is pressed against the PMDS and then is peeled off rapidly.

Figure 4B:
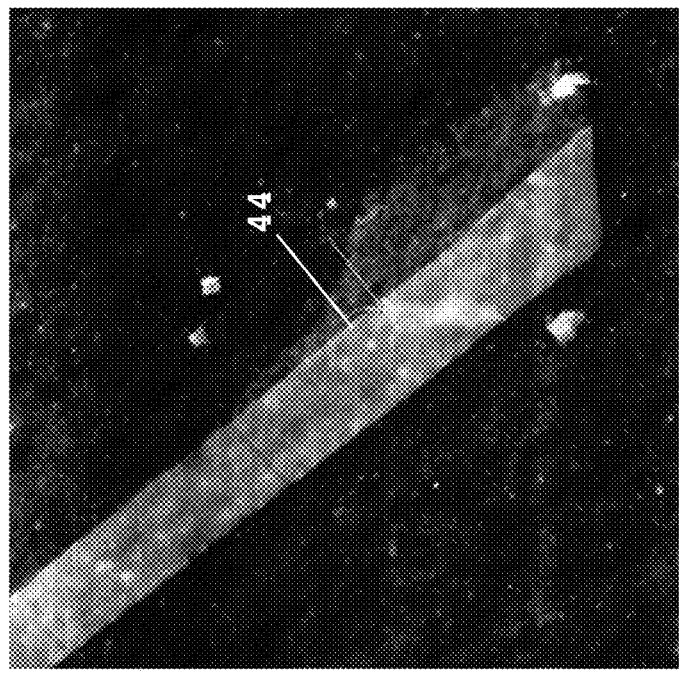
FIG. 4 shows An AFM image of a transparent monoatomic graphene layer deposited on $SiO_2$/Si structure (a) and an AFM image of a three-layered h-BN fabricated with exfoliation technique (b)
Figure 4A:
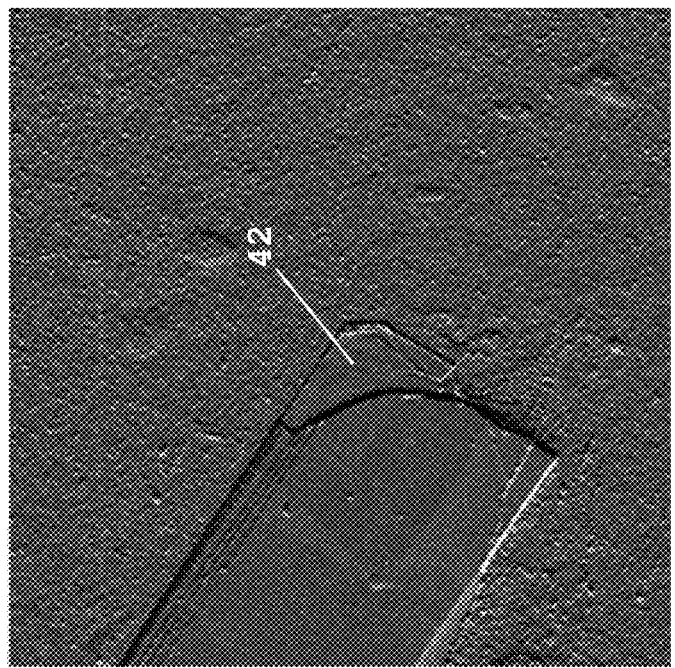

FIG. 4(b) shows the h-BN flake 44 identified by an optical microscope. The identified flake with the right thickness is chosen for transfer. A similar process is used to fabricate the $WSe_2$ layer, the top h-BN tunnel barrier and also the top transparent monoatomic-layered graphene electrode on the PMDS stamps, ready for transferring. The as-fabricated layers on PMDS stamps are transferred and stacked on top of the bottom electrode of graphene. For example, to stack the bottom h-BN barrier, the surface of PMDS stamp that contains three-layered h-BN is faced to the graphene on $SiO_2$/Si substrate and the alignment between the graphene and h-BN flakes was performed by a micromanipulator under the microscope. By pressing the PDMS stamp against the substrate and then peeling off the PDMS stamp, the h-BN tunnel barrier is stacked on top of the graphene bottom electrode. By repeating procedure above, the $WSe_2$ layer, the top h-BN tunnel barrier layer and also the top transparent monoatomic-layered graphene electrode are stacked on each other to form the light-emitting quantum well.

Before the $WSe_2$ layer is exfoliated from the crystal, a laser-treatment on the surface of crystal with focused laser beam was used to improve the electrical and photoconductive properties of the $WSe_2$ layer by controlling the photochemical reaction on the surface of the $WSe_2$ layers. A common defect in $WSe_2$ thin film is the Se vacancies that can act as free carrier scattering and trapping due to their deep energy level in the bandgap. As a result, the occurrence of these defects in $WSe_2$ layers can significantly lower the conductivity and photoconductivity. The laser-treatment of $WSe_2$ with focused laser beam can significantly enhance the desirable electronic and optical properties by inducing oxygen substitution in the Se vacancies. Since oxygen has the same valence state as Se, it can act as an isoelectronic substitution on the Se vacancy site to improve the overall quality of the $WSe_2$ layer as demonstrated in previous study. Specifically, $WSe_2$ photodetector device has been shown to exhibit an increase of 400 times in output current after its exposure to laser annealing.

In addition, the Inventors have found that the laser annealing process also provides a micropatterning effect through heat from the focused laser beam. The sample absorbs the photons and converts the energy into thermal energy. The generated heat facilitates the sublimation of the upper layers to realize the direct thinning. As a result, the laser treatment can be used to pattern a quantum dot structure embedded in a mono or multilayered sample.

Laser Beam Treatment Details

The laser annealing was performed with a laser beam with a wavelength of 532 nm and 300 mW power passing through an optical microscope. The laser beam was focused by an objective lens to create a spot size of ~1 μm onto the $WSe_2$ surface. The sample is placed on a motorized stage so the laser beam can scan the entire sample. The sample is conducted in an ambient condition to allow maximum exposure to oxygen gas. The sample is also exposed to other gases like CO, NO and $NO_2$ to repair the Se vacancies. The photoconductivity performance of the $WSe_2$ exposed to different gas under different laser treatment is compared to determine the optimal laser annealing condition. Furthermore, the laser spot size is also controlled by varying the numerical aperture of the focused lens to achieve a nanometer scale spot size to pattern the nanoflake quantum dots with three specified sizes embedded inside the $WSe_2$ layer. The $WSe_2$ layer embedded by nanoflake quantum dots is exfoliated, transferred and then stacked on the bottom h-BN tunnel barrier as described above.

Figure 5:
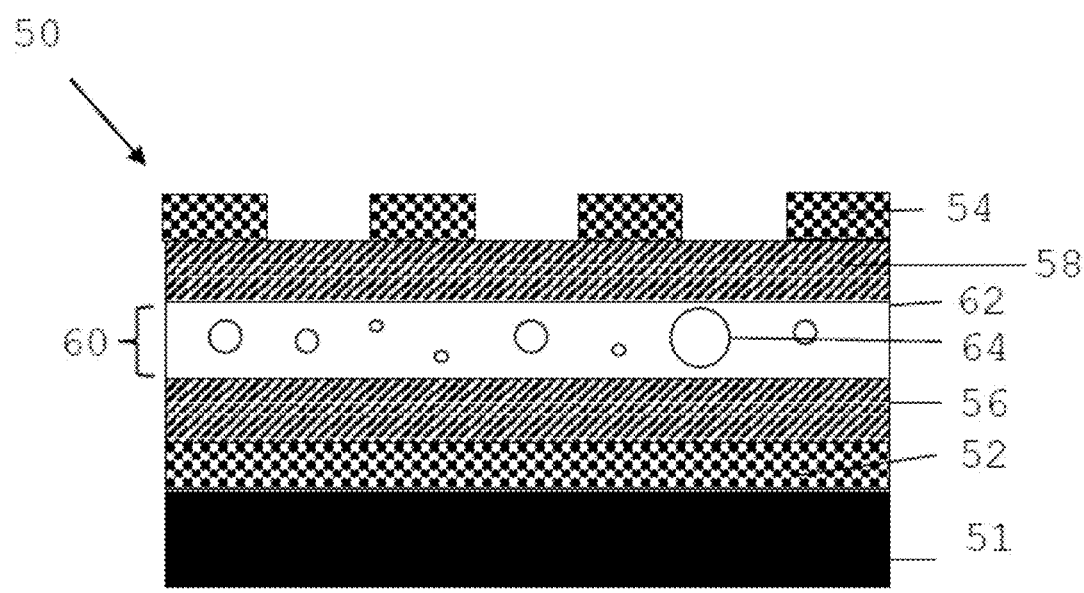
FIG. 5 shows a schematic representation of a photovoltaic cell in accordance with embodiments.

Referring now to FIG. 5, there is shown a schematic configuration of a PV cell 50 in accordance with embodiments. The PV cell operates based on a similar principle to the LED device described above, but in reverse. The PV cell 50 absorbs incoming photons at a specific wavelength through layer 60. The absorption wavelength can be tuned by engineering the nanoparticles 64, the $WSe_2$ layer 62, and the voltage applied across the device. The photo-generated carriers are extracted from device 50 through conductive electrodes 52 and 54.

The light emission wavelengths of the LED with the tunable $WSe_2$-based emitting layer are tunable between 450 nm and 775 nm dependent on the embedded materials in the $WSe_2$-based layer.

The emitting layer $WSe_2$-QD can be used as many-body excitonic emission for photovoltaic devices. The QD is dispersed in the single layer $WSe_2$. The exciton is formed between the holes in $WSe_2$ and electron in the QD. The exciton lifetime and wavelength can be tuned by changing the chemical composition and the sizes of the QDs.

The emitting layer can comprise a multilayer of single $WSe_2$-QD like $WSe_2$-QD-TMD, in which the QD is embedded between the $WSe_2$ single layer and another single layer TMD to tune the excitonic lifetime and wavelength.

In embodiments, a power conversion efficiency (PCE) for the PV device higher than the theoretical efficiency of conventional organic dye (~8.1%) solar cell can be obtained.

In alternative embodiments, different confining layers can be used instead of BN. Using wide bandgap perovskite materials, for example, can be useful for display, communications and lighting applications.

Other applications of the technology described herein include: variable wavelength LEDs for enhancing the capacity of telecommunication signals or channels via wireless telecommunication or optical fibres; enhanced LED displays; agriculture lightings; medical lighting; sterilization; wearable mobile communication and medical devices. Further, the $WSe_2$-based emitting layer can be used as saturable absorber for tunable wavelength lasers.

The term "comprising" (and its grammatical variations) as used herein are used in the inclusive sense of "having" or "including" and not in the sense of "consisting only of".

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

The invention claimed is:

1. An inorganic light emitting device comprising:
    a transition metal dichalcolgenide layer disposed between two layers of a material with a bandgap larger than the transition metal dichalcolgenide layer;
    a plurality of nanoparticles embedded into the transition metal dichalcolgenide layer and being arranged to form a plurality of allowable energy levels within the bandgap of the transition metal dichalcolgenide layer, wherein the plurality of nanoparticles comprise a first set of nanoparticles with an average size between 2 nm and 3 nm, a second set of nanoparticles with an average size between 5 nm and 6 nm, and a third set of nanoparticles with an average size between 9 nm and 10 nm; and
    electrodes arranged to apply a voltage across the two layers and the transition metal dichalcolgenide layer;
    wherein, when a voltage within a predetermined range is applied to the electrodes, photons with a wavelength within a specific wavelength range are emitted by the device and the wavelength range can be varied by varying the voltage across the two layers and the transition metal dichalcolgenide layer.

2. The device of claim 1 wherein the voltage within a predetermined range is applied to the pair of electrodes at room temperature and ambient pressure conditions.

3. The device of claim 1, wherein the transition metal dichalcolgenide layer consists of tungsten diselenide.

4. The device of claim 3, wherein the transition metal dichalcolgenide layer consists of less than thirty atomic monolayers of tungsten diselenide.

5. The device of claim 3, wherein the transition metal dichalcolgenide layer consists of less than five atomic monolayers of tungsten diselenide.

6. The device of claim 3, wherein the transition metal dichalcolgenide layer consists of a single atomic monolayer of tungsten diselenide.

7. The device of claim 1, wherein the plurality of nanoparticles consist of tungsten diselenide nanoparticles.

8. The device of claim 7, wherein the plurality of tungsten diselenide nanoparticles are in the form of tungsten diselenide flakes.

9. The device of claim 1, wherein the transition metal dichalcolgenide layer forms one or more light emitting layer, wherein the two layers comprise wide bandgap materials.

10. The device of claim 1, wherein the nanoparticles comprise tungsten diselenide nanoparticles with a standard size deviation between 0.5 nm and 2 nm.

11. An inorganic photovoltaic device comprising:
    a transition metal dichalcolgenide layer disposed between two layers of a material with a bandgap larger than the transition metal dichalcolgenide layer;
    a plurality of nanoparticles embedded into the transition metal dichalcolgenide layer and being arranged to form a plurality of allowable energy levels within the bandgap of the transition metal dichalcolgenide layer, wherein the plurality of nanoparticles comprise a first set of nanoparticles with an average size between 2 nm and 3 nm, a second set of nanoparticles with an average size between 5 nm and 6 nm, and a third set of nanoparticles with an average size between 9 nm and 10 nm; and
    electrodes arranged to apply a voltage across the two layers and the transition metal dichalcolgenide layer;
    wherein, when a voltage within a predetermined range is applied to the electrodes at room temperature and ambient pressure conditions, photons with a certain wavelength are emitted by the device and the wavelength of the photons can be varied by varying the applied voltage.

* * * * *